(12) United States Patent
Ho et al.

(10) Patent No.: US 11,984,355 B2
(45) Date of Patent: May 14, 2024

(54) METHOD FOR MANUFACTURING AN INTERCONNECTION STRUCTURE HAVING A BOTTOM VIA SPACER

(71) Applicant: TAIWAN SEMICONDUCTOR MANUFACTURING CO., LTD., Hsinchu (TW)

(72) Inventors: Po-Kuan Ho, Taipei (TW); Chia-Tien Wu, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/829,950

(22) Filed: Jun. 1, 2022

(65) Prior Publication Data

US 2022/0293465 A1  Sep. 15, 2022

Related U.S. Application Data

(60) Continuation of application No. 17/018,733, filed on Sep. 11, 2020, now Pat. No. 11,488,861, which is a division of application No. 15/704,202, filed on Sep. 14, 2017, now Pat. No. 10,777,452.

(51) Int. Cl.
| | |
|---|---|
| *H01L 21/768* | (2006.01) |
| *H01L 23/522* | (2006.01) |
| *H01L 23/528* | (2006.01) |
| *H01L 23/532* | (2006.01) |

(52) U.S. Cl.
CPC .. *H01L 21/76843* (2013.01); *H01L 21/76802* (2013.01); *H01L 21/76811* (2013.01); *H01L 21/76813* (2013.01); *H01L 21/76831* (2013.01); *H01L 21/76877* (2013.01); *H01L 21/76879* (2013.01); *H01L 21/76897* (2013.01);
(Continued)

(58) Field of Classification Search
CPC ....... H01L 21/76802–76813; H01L 21/76877; H01L 21/76879; H01L 21/76897; H01L 21/76843–76852; H01L 21/76865; H01L 21/76831; H01L 21/76834; H01L 21/28562; H01L 21/76816; H01L 21/76883; H01L 21/76895; H01L 21/823475; H01L 21/823871; H01L 23/5226; H01L 23/5283; H01L 23/53257; H01L 23/53261; H01L 23/53223; H01L 23/53238; H01L 23/53252; H01L 23/53266

See application file for complete search history.

(56) References Cited

U.S. PATENT DOCUMENTS

| | | |
|---|---|---|
| 6,261,963 B1 | 7/2001 | Zhao et al. |
| 6,492,270 B1 | 12/2002 | Lou |
| 7,402,514 B2 | 7/2008 | Tsu et al. |

(Continued)

*Primary Examiner* — Younes Boulghassoul
(74) *Attorney, Agent, or Firm* — Birch, Stewart, Kolasch & Birch, LLP

(57) ABSTRACT

A method includes providing a semiconductor structure including a dielectric layer having an opening exposing a top surface of a metal layer. A bottom via is selectively deposited in the opening and over the metal layer. A barrier layer is deposited over the bottom via and in contact with the dielectric layer at a sidewall of the opening. A top via is formed in the opening, in contact with the barrier layer, and over the bottom via. The top via is separated from the dielectric layer by the barrier layer.

20 Claims, 12 Drawing Sheets

(52) U.S. Cl.
CPC ...... *H01L 23/5226* (2013.01); *H01L 23/5283* (2013.01); *H01L 23/53238* (2013.01)

(56) References Cited

U.S. PATENT DOCUMENTS

| | | | |
|---|---|---|---|
| 7,727,888 | B2 | 6/2010 | Yang et al. |
| 8,728,332 | B2 | 5/2014 | Lin et al. |
| 8,796,666 | B1 | 8/2014 | Huang et al. |
| 8,822,243 | B2 | 9/2014 | Yan et al. |
| 8,987,142 | B2 | 3/2015 | Lee et al. |
| 9,030,013 | B2 | 5/2015 | Peng et al. |
| 9,053,279 | B2 | 6/2015 | Chang et al. |
| 9,093,530 | B2 | 7/2015 | Huang et al. |
| 9,099,530 | B2 | 8/2015 | Lin et al. |
| 9,153,478 | B2 | 10/2015 | Liu et al. |
| 9,501,601 | B2 | 11/2016 | Chang et al. |
| 9,548,303 | B2 | 1/2017 | Lee et al. |
| 9,793,156 | B1 | 10/2017 | Yang |
| 2001/0000115 | A1 | 4/2001 | Greco et al. |
| 2001/0022398 | A1 | 9/2001 | Grill et al. |
| 2003/0087514 | A1 | 5/2003 | Tang et al. |
| 2004/0056366 | A1 | 3/2004 | Maiz et al. |
| 2005/0153505 | A1 | 7/2005 | Gambino et al. |
| 2007/0224824 | A1 | 9/2007 | Chen et al. |
| 2009/0014887 | A1 | 1/2009 | Ohtake et al. |
| 2010/0025855 | A1* | 2/2010 | Streck ............... H01L 21/76814 438/653 |
| 2011/0183512 | A1 | 7/2011 | Cho et al. |
| 2011/0248402 | A1 | 10/2011 | Choi |
| 2012/0153490 | A1 | 6/2012 | Vannier |
| 2015/0270211 | A1 | 9/2015 | Kobrinsky et al. |
| 2016/0027738 | A1 | 1/2016 | Murray et al. |
| 2016/0056071 | A1* | 2/2016 | Draeger ............ H01L 21/76826 438/653 |
| 2016/0118296 | A1* | 4/2016 | Kolics ............... H01L 21/76877 438/653 |
| 2016/0118335 | A1* | 4/2016 | Lee .................... H01L 23/53266 257/774 |
| 2016/0307793 | A1* | 10/2016 | Huang ............. H01L 23/53209 |
| 2017/0053864 | A1 | 2/2017 | Peng et al. |
| 2017/0170113 | A1* | 6/2017 | Edelstein .......... H01L 23/53238 |
| 2017/0338148 | A1 | 11/2017 | Shusterman et al. |

* cited by examiner

METHOD FOR MANUFACTURING AN INTERCONNECTION STRUCTURE HAVING A BOTTOM VIA SPACER

PRIORITY CLAIM AND CROSS-REFERENCE

This application is a continuation application of U.S. patent application Ser. No. 17/018,733, filed Sep. 11, 2020, which is a divisional application of U.S. patent application Ser. No. 15/704,202, filed Sep. 14, 2017, now U.S. Pat. No. 10,777,452, issued on Sep. 15, 2020, which is herein incorporated by reference in its entirety.

BACKGROUND

An interconnect structure acts to transfer signals between elements of an integrated circuit. The interconnect structure is a three-dimensional lattice work of lines and vias separated by a dielectric material over a substrate, with the lines extending substantially in a horizontal direction and the vias are located to provide electrical connection between different layers of lines. A layer includes a line and the via electrically connected to a surface of the line closest to the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
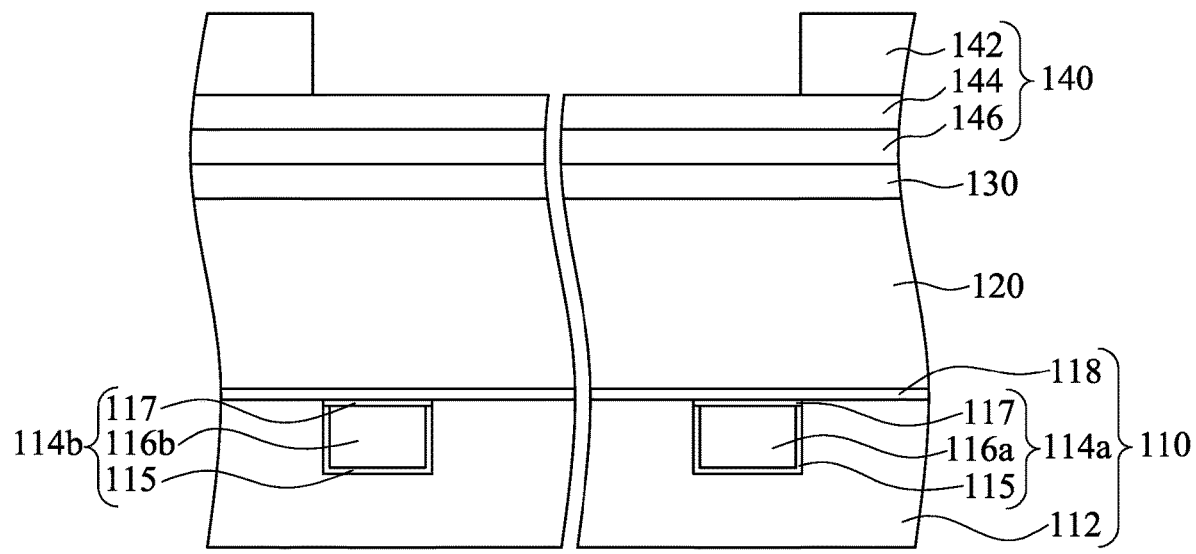
FIGS. 1A to 1I are cross-sectional views of a method for manufacturing an interconnect structure at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

In semiconductor technology, an integrated circuit pattern can be defined on a substrate using a photolithography process. Dual damascene processes are utilized to form multilayer interconnections including vertical interconnection vias/contacts and horizontal interconnection metal lines. During a dual damascene process, a plug filling material is employed to fill in the vias (or contacts) and the material is then polished back. However, the vias (or contacts) are defined by a different lithography process and may cause misalignments between the underlying metal lines and the vias. When the semiconductor technologies move forward to advanced technology nodes with smaller feature sizes, the misalignments have less tolerance and may cause short or other issues. As such, the following paragraphs provide interconnect structures and manufacturing method thereof to improve the short problem.

FIGS. 1A to 1I are cross-sectional views of a method for manufacturing an interconnect structure at various stages in accordance with some embodiments of the present disclosure. Reference is made to FIG. 1A. A wafer 110 is provided. The wafer 110 includes a first dielectric layer 112 formed thereon is shown. The wafer 110 may include a substrate (not explicitly shown) underlying the first dielectric layer 112, and may include, for example, bulk silicon, doped or undoped, or an active layer of a semiconductor-on-insulator (SOI) substrate. In some embodiments, an SOI substrate includes a layer of a semiconductor material, such as silicon, formed on an insulator layer. The insulator layer may be, for example, a buried oxide (BOX) layer or a silicon oxide layer.

The insulator layer is provided on a substrate and may be a silicon or glass substrate. Other substrates, such as a multi-layered or gradient substrate may also be used.

In some embodiments, electrical circuitry is formed on the substrate and may be some types of circuitry suitable for a particular application. In some embodiments, the electrical circuitry includes electrical devices formed on the substrate with one or more dielectric layers overlying the electrical devices. Metal layers may be formed between overlying dielectric layers, such as those discussed herein, to route electrical signals between the electrical devices. Electrical devices may also be formed in one or more dielectric layers.

For example, the electrical circuitry may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

The first dielectric layer 112 may be formed, for example, of a low-K dielectric material (materials having a dielectric constant lower than silicon dioxide), such as silicon oxynitride, phosphosilicate glass (PSG), borophosphosilicate glass (BPSG), fluorinated silicate glass (FSG), SiOxCy, SiOxCyHz, Spin-On-Glass, Spin-On-Polymers, silicon carbon material, compounds thereof, composites thereof, combinations thereof, or the like, by suitable methods, such as spinning, chemical vapor deposition (CVD), and plasma-enhanced CVD (PECVD). Other materials, such as ultra low-k materials (e.g., having a dielectric constant less than about 2.9), such as k=2.5-2.6, may also be used. These materials and processes are provided as examples and other materials and processes may be used.

Filling materials 116a and 116b are formed in the first dielectric layer 112. The filling materials 116a and 116b may be formed by, for example, creating openings in the first dielectric layer 112 using photolithography techniques. In some embodiments, photolithography techniques involve applying a photoresist material (not shown) and exposing the photoresist material in accordance with a desired pattern. The photoresist material is then developed to remove a portion of the photoresist material, thereby exposing the underlying material in accordance with the desired pattern. The remaining photoresist material protects the underlying material from subsequent processing operations, such as etching, performed to form the openings in which the filling materials 116a and 116b are to be formed in the first dielectric layer 112. The etching process may be a wet or dry, anisotropic or isotropic, etch process, such as an anisotropic dry etch process. After the opening is formed in the first dielectric layer 112, a conductive material may be deposited to fill the openings. The filling materials 116a and 116b may include metals, elemental metals, transition metals, or the like, such as a copper interconnect.

In some embodiments, before the formation of the filling materials 116a and 116b, barrier layers 115 can be conformally formed in the openings of the first dielectric layer 112, and the filling materials 116a and 116b are formed on the barrier layers 115. In some embodiments, the barrier layers 115 are metal layers including Ta, TaN, Co, Ru, Ti, TiN, or combinations thereof. The barrier layers 115 may be formed using methods such as physical vapor deposition (PVD), sputtering, chemical vapor deposition (CVD), atomic layer deposition (ALD), and the like.

Moreover, cap layers 117 are formed on the filling materials 116a and 116b and optionally on the barrier layers 115. The cap layers 117 include materials such as Co, Ta, CoWP, Pt, or combinations thereof. Since the cap layers 117 have a better characteristic match with the filling materials 116a and 116b than a dielectric, electro migration and stress migration are reduced and thus device reliability is improved. In some embodiments, the filling materials 116a and 116b are copper or copper alloys so that the cap layers 117 can be formed as a copper silicide. Growth of the cap layers 117 can be performed by a chemical vapor reaction (CVR) process that involves introducing a chemical vapor of $SiH_4$ gas into a chamber to react with copper. In some other embodiments, the cap layers 117 can be formed by electro-less plating. In yet some other embodiments, the cap layers 117 can be deposited using techniques such as sputtering and CVD and then etched. As such, the filling material 116a, the barrier layer 115, and the cap layer 117 form a conductive element 114a, and the filling material 116b, the barrier layer 115, and the cap layer 117 form a conductive element 114b, in which the conductive elements 114a and 114b are embedded in the first dielectric layer 112. In some embodiments, the depth of the conductive elements 114a and 114b is about 5 nm to about 50 nm.

Optionally, over the first dielectric layer 112 and the conductive elements 114a, 114b is an etch stop layer (ESL) 118 in accordance with some embodiments. In some embodiments, the etch stop layers provide a mechanism to stop an etching process when forming vias and/or contacts. The etch stop layers are formed of a dielectric material having a different etch selectivity from adjacent layers, e.g., the underlying first dielectric layer 112 or the substrate. In some embodiments, etch stop layers may be formed of SiNx, SiCN, $SiO_2$, CN, AlOxNy, combinations thereof, or the like, deposited by CVD or PECVD techniques. In some embodiments, the thickness of the ESL 118 is about 2 nm to about 20 nm.

Over the wafer 100 (including the first dielectric layer 112, the conductive elements 114a, 114b, and the ESL 116 in this case) is a second dielectric layer 120 in accordance with some embodiments. As discussed in greater detail below, the second dielectric layer 120 is the layer that is to be subsequently patterned to, for example, form conductive lines and/or vias. For example, the second dielectric layer 120 may be patterned to form vias extending to the conductive elements 114a, 114b and to form conductive lines to interconnect various electrical elements.

The second dielectric layer 120 may be formed of similar materials using similar processes as those used to form the first dielectric layer 112; however, different materials and processes may be used. Additionally, the first dielectric layer 112 may be formed of the same or different material as that used to form the second dielectric layer 120.

It should be noted that the first dielectric layer 112 and the conductive elements 114a, 114b are shown for illustrative purposes. In some other embodiments, the first dielectric layer 112 may be replaced with a dielectric material on semiconductor substrate with transistors fabricated and can be with or without the ESL 118. The conductive elements 114a and 114b may be contacts to the electrical devices. For example, in some other embodiments, the second dielectric layer 120 (the layer to be patterned) is an inter-layer dielectric layer formed over a substrate having electrical Fin devices formed thereon. The second dielectric layer 120 is subsequently patterned to form contacts to the conductive elements 114a and 114b.

A nitrogen free anti-reflection layer (NFARL) 130 is formed on the second dielectric layer 120. Forming damascene structures may use lithographic processes. Many of the underlying material layers may include energy sensitive resist materials which are reflective to ultraviolet light used in the lithographic processes. These reflections can distort the dimensions of features such as lines and vias that are formed in the energy sensitive material. Anti-reflective coating (ARC) or anti-reflection layer (ARL) may be used to minimize reflections from an underlying material layer. The ARC suppresses the reflections of the underlying material layer during resist imaging, providing accurate pattern replication in the layer of energy sensitive resist. In some embodiments, ARC materials may contain nitrogen, including silicon nitride and titanium nitride. Nitrogen in the ARC layer may chemically alter the composition of the photoresist material. The chemical reaction between nitrogen and the photoresist material is referred to as photoresist poisoning. The altered photoresist material may not be lithographically patterned as expected and result in imprecisely formed features in the photoresist material, which can detrimentally affect subsequent processes, such as etching processes. Therefore, the NFARL 130 can be used over the second dielectric layer 120.

A tri-layer photoresist 140 is formed on the NFARL 130 and may include a photoresist (PR) layer 142 as the top or uppermost portion, a middle layer 144, and a bottom layer 146. The tri-layer photoresist 140 provides the PR layer 142, the middle layer 144 which may include anti-reflective layers or backside anti-reflective layers to aid in the exposure and focus of the PR processing, and the bottom layer 146 which may be a hard mask material; for example, a nitride. To pattern the tri-layer photoresist 140, the PR layer 142 is patterned using a mask, exposure to radiation, such as light or an excimer laser, for example, a bake or cure operation to harden the resist, and use of a developer to remove either the exposed or unexposed portions of the resist, depending on whether a positive resist or a negative resist is used, to form the pattern from the mask in the PR layer 142. This patterned PR layer 142 is then used to etch the underlying middle layer 144 and bottom layer 146 to form an etch mask for the target layer; here, the NFARL 130.

Figure 1B:
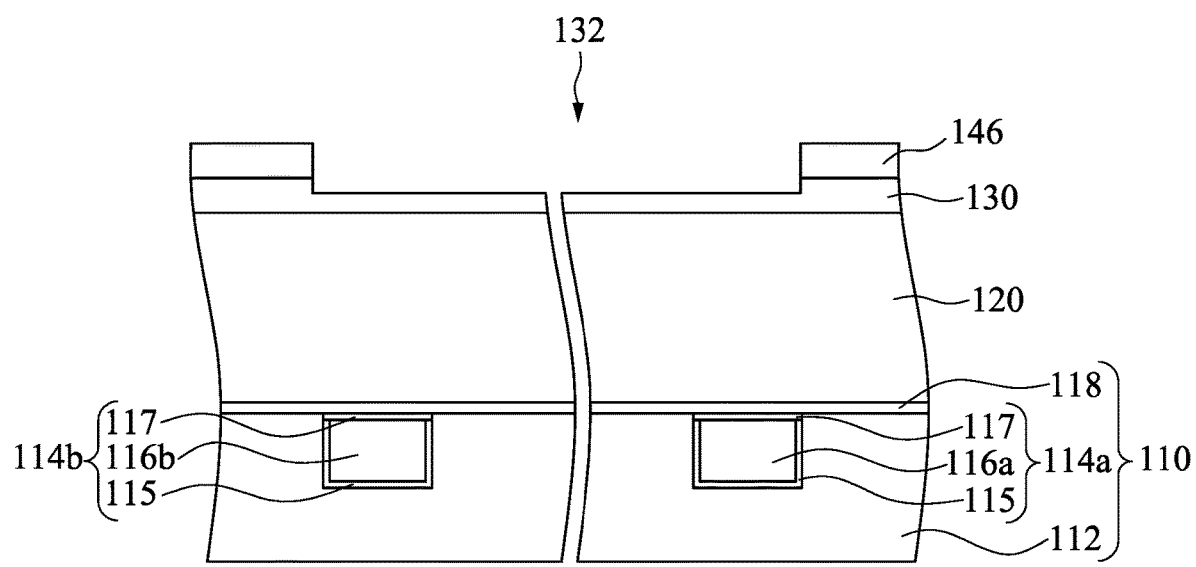

Reference is made to FIG. 1B. A trench etching is performed to pattern the NFARL 130. The patterned PR layer 142 (see FIG. 1A) is used as a mask during the trench etching. In the trench etching, the middle layer 144 (see FIG. 1A), the bottom layer 146, and the NFARL 130 may be etched by various methods, including a dry etch, a wet etch, or a combination of dry etch and wet etch. The dry etching process may implement fluorine-containing gas (e.g., $CF_4$, $SF_6$, $CH_2F_2$, $CHF_3$, and/or $C_2F_6$), chlorine-containing gas (e.g., $C_{12}$, $CHC_{13}$, $CC_{14}$, and/or $BC_{13}$), bromine-containing gas (e.g., HBr and/or $CHBR_3$), oxygen-containing gas, iodine-containing gas, other suitable gases and/or plasmas, or combinations thereof. The etching process may include a multiple-step etching to gain etch selectivity, flexibility and desired etch profile. After the NFARL 130 is patterned, the PR layer 142 and the middle layer 144 are removed, and at least one opening 132 is formed in the NFARL 130.

Figure 1C:
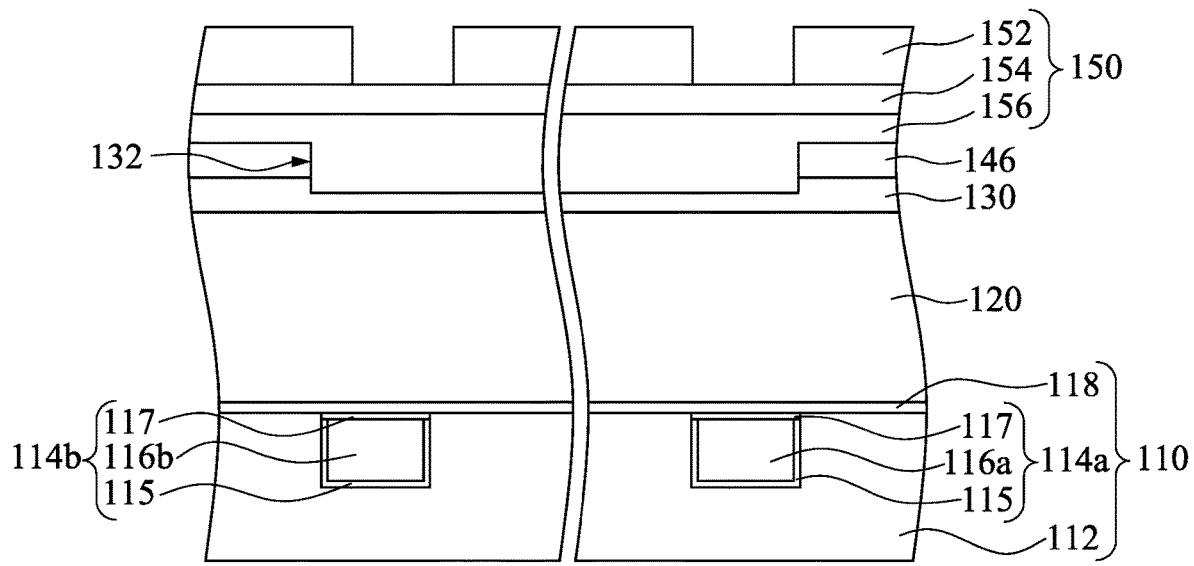

Reference is made to FIG. 1C. Another tri-layer photoresist 150 may be used, including a photoresist (PR) layer 152 as the top or uppermost portion, a middle layer 154, and a bottom layer 156. The tri-layer photoresist 150 covers the patterned bottom layer 146 and the patterned NFARC 130. The tri-layer photoresist 150 provides the PR layer 152, the middle layer 154 which may include anti-reflective layers or backside anti-reflective layers to aid in the exposure and focus of the PR processing, and the bottom layer 156 which may be a hard mask material; for example, a nitride. The bottom layer 156 may fill the opening 132 of the NFARL 130 in some embodiments.

The PR layer 152 of the tri-layer photoresist 150 is then patterned. The patterned PR layer 152 exposes portions of the middle layer 154 disposed respectively above the conductive elements 114a and 114b. To pattern the tri-layer photoresist 150, the PR layer 152 is patterned using a mask, exposure to radiation, such as light or an excimer laser, for example, a bake or cure operation to harden the resist, and use of a developer to remove either the exposed or unexposed portions of the resist, depending on whether a positive resist or a negative resist is used, to form the pattern from the mask in the PR layer 152. This patterned PR layer 152 is then used to etch the underlying middle layer 154 and bottom layer 156 to form an etch mask for the target features; here, the NFARL 130 and the second dielectric layer 120.

Figure 1D:
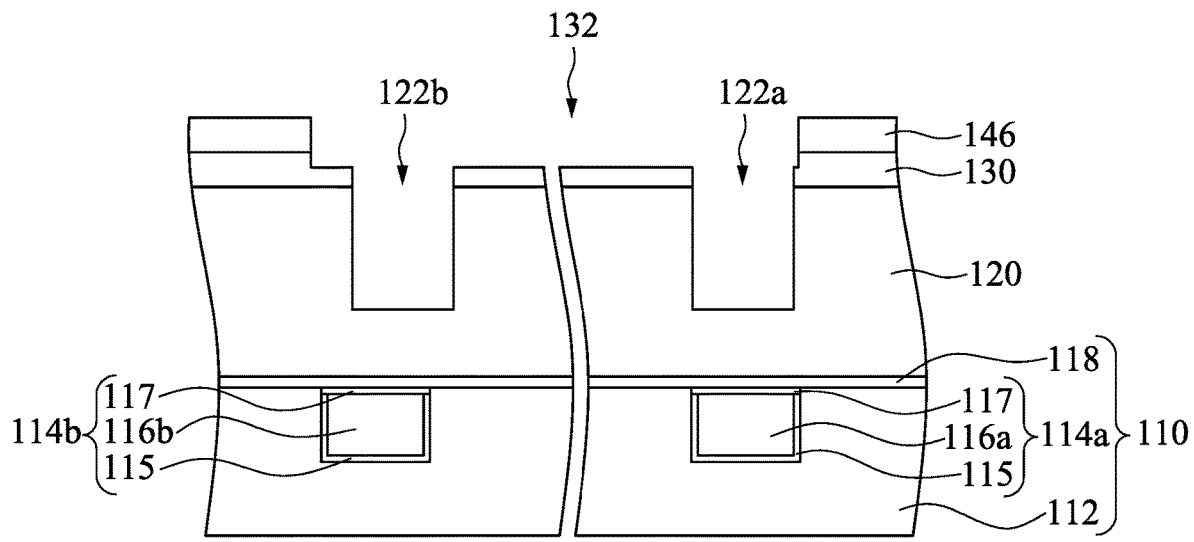

Reference is made to FIG. 1D. A via etching is performed to pattern the NFARL 130 and the second dielectric layer 120. The patterned PR layer 152 (see FIG. 1C) is used as a mask during the via etching. In the via etching, the middle layer 154 (see FIG. 1C), the bottom layer 156, the middle layer 144, the NFARL 130, and the second dielectric layer 120 may be etched by various methods, including a dry etch, a wet etch, or a combination of dry etch and wet etch. The dry etching process may implement fluorine-containing gas (e.g., $CF_4$, $SF_6$, $CH_2F_2$, $CHF_3$, and/or $C_2F_6$), chlorine-containing gas (e.g., $C_{12}$, $CHC_{13}$, $CC_{14}$, and/or $BC_{13}$), bromine-containing gas (e.g., HBr and/or $CHBR_3$), oxygen-containing gas, iodine-containing gas, other suitable gases and/or plasmas, or combinations thereof. The etching process may include a multiple-step etching to gain etch selectivity, flexibility and desired etch profile. After the NFARL 130 and the second dielectric layer 120 are patterned, the tri-layer photoresist 150 is removed, and a plurality of openings 122a and 122b are formed in the second dielectric layer 120 and respectively above the conductive elements 114a and 114b.

Figure 1E:
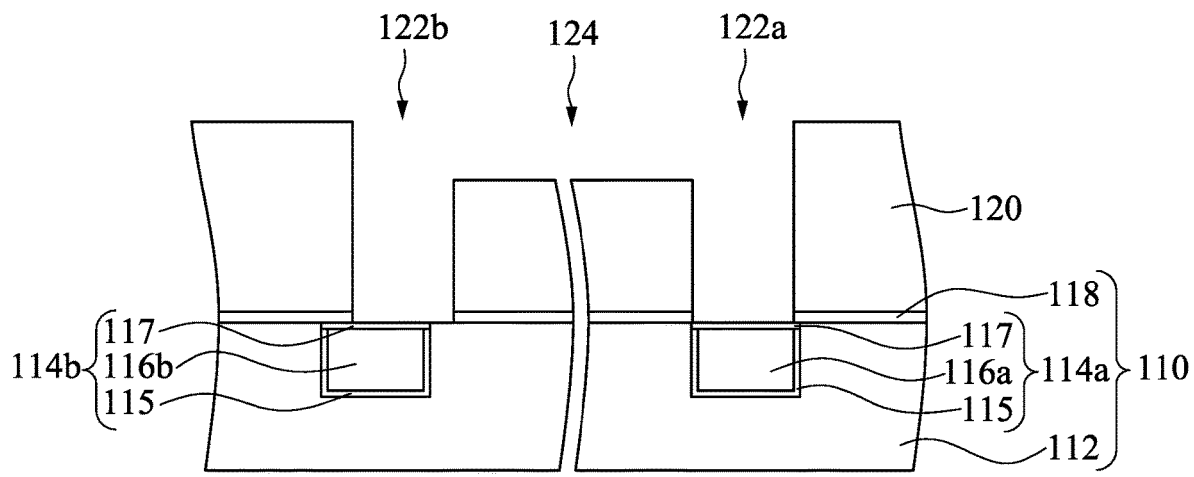

Reference is made to FIG. 1E. The openings 132 (see FIG. 1D), 122a, and 122b are deepened. For example, the second dielectric layer 120 and the ESL 118 may be etched by various methods, including a dry etch, a wet etch, or a combination of dry etch and wet etch. The etching process may include a multiple-step etching to gain etch selectivity, flexibility and desired etch profile. After the second dielectric layer 120 and the ESL 118 etched, the deepened openings 122a and 122b respectively expose the conductive elements 114a and 114b, and at least one opening 124 is formed in the second dielectric layer 120. In some embodiments, the opening 124 interconnect the openings 122a and 122b, and the present disclosure is not limited in this respect. After the openings 132, 122a, and 122b are deepened, the bottom layer 146 and the NFARL 130 (see FIG. 1D) are removed. Moreover, in some embodiments, the opening 122b further exposes a portion of the first dielectric layer 112. That is, the opening 122b is misaligned with the conductive element 114b. On the other hand, the opening 122a is aligned with the conductive element 114a. In some embodiments, a depth of the opening 124 is about 5 nm to about 60 nm, and a thickness of the second dielectric layer 120 under the opening 124 is about 5 nm to about 50 nm.

Figure 1F:
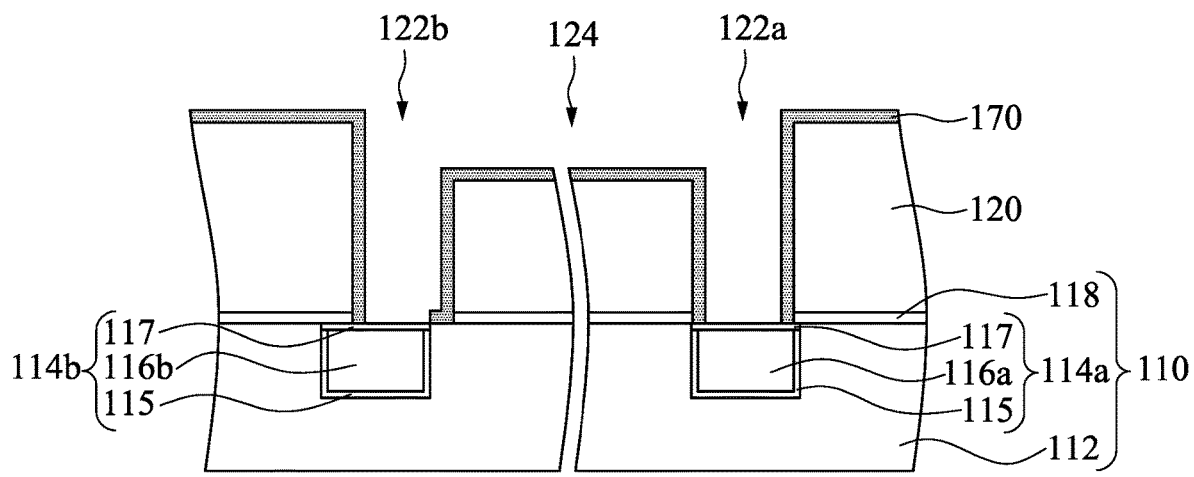

Reference is made to FIG. 1F. A dielectric spacer layer 170 is selectively formed on the exposed surfaces of the first dielectric layer 112 and the second dielectric layer 120 (including the surfaces defining the openings 122a, 122b, and 124). In some embodiments, the dielectric spacer layer 170 is formed by an atomic layer deposition (ALD) process. The ALD process includes providing alternating pulses of a metal precursor and a hydroxyl precursor to a reaction chamber. Pulses of reactants saturate the surface in a self-limiting manner.

An exemplary ALD process in which the dielectric spacer layer 170 is formed includes the following operations. The structure of FIG. 1E is loaded into a reaction chamber. Then, a pulse of a hydroxyl precursor is injected into the reaction chamber loaded with the structure for a first period of time. Here, the hydroxyl precursor includes a chemical selected from the group consisting of $H_2O$, $H_2O_2$, and/or $O_3$. As the hydroxyl precursor is injected into the reaction chamber, a chemisorption layer of the hydroxyl precursor is selectively formed on the exposed surfaces of the first dielectric layer 112 and the second dielectric layer 120, but not formed on exposed surfaces of the cap layers 117. Then, the residual hydroxyl precursor is discharged from the reaction chamber for a second period of time. To more effectively discharge the residual hydroxyl precursor from the reaction chamber, purge gas may be injected into the reaction chamber during this purging period, wherein the purge gas may include an inert gas such as $N_2$, Ar, He, or similar inert gases.

After discharging the residual hydroxyl precursor from the reaction chamber, a pulse of a metal precursor is injected into the reaction chamber for a third period of time. Here, the metal precursor possesses a high reaction probability with the chemisorption layer of the hydroxyl precursor. As some examples, the metal precursor includes a tetrachloro transition metal complex. In some embodiments, the tetrachloro transition metal complex includes a chemical selected from the group consisting of $ZrCl_4$, $HfCl_4$, $AlCl_4$, and $TiCl_4$. The metal precursor reacts with the chemisorption layer of the hydroxyl precursor at a temperature of about 200° C. to 400° C. As a result, an atomic layer of the dielectric spacer layer 170 is formed on the exposed surfaces of the first dielectric layer 112 and the second dielectric layer 120, but not formed on the exposed surfaces of the cap layers 117. In FIG. 1F, the dielectric spacer layer 170 is a high-κ dielectric layer including a metal oxide. In some embodiments, the metal oxide includes zirconium oxide, hafnium oxide, aluminum oxide, titanium oxide, and/or other suitable materials. In some other embodiments, the dielectric spacer layer 170 can be made of $SiO_2$, SiNx, AlxOy, AlON, SiOxCy, SiCxNy, or other suitable materials.

Then, the residual metal precursor is discharged from the reaction chamber for a fourth period of time. To more effectively discharge the residual metal precursor from the reaction chamber during this fourth purging period, an inert gas such as $N_2$, Ar, He, or the like may be injected into the reaction chamber.

In some embodiments, the ALD process includes a sequence of ALD cycles, i.e., the first through fourth time periods, as described above, during which each of the hydroxyl precursor and the metal precursor is alternately injected into and thereafter discharged from the reaction chamber, when taken together are regarded as one deposition or layer formation cycle. By repeating this cycle multiple times, the dielectric spacer layer 170 with a desired thickness is thereby formed. The dielectric spacer layer 170 may have a thickness of about 0.5 nm to about 5 nm. After the deposition process, the dielectric spacer layer 170 is conformally formed on the exposed surfaces of the first dielectric layer 112 and the second dielectric layer 120, but not formed on the exposed surfaces of the cap layers 117.

Figure 1G:
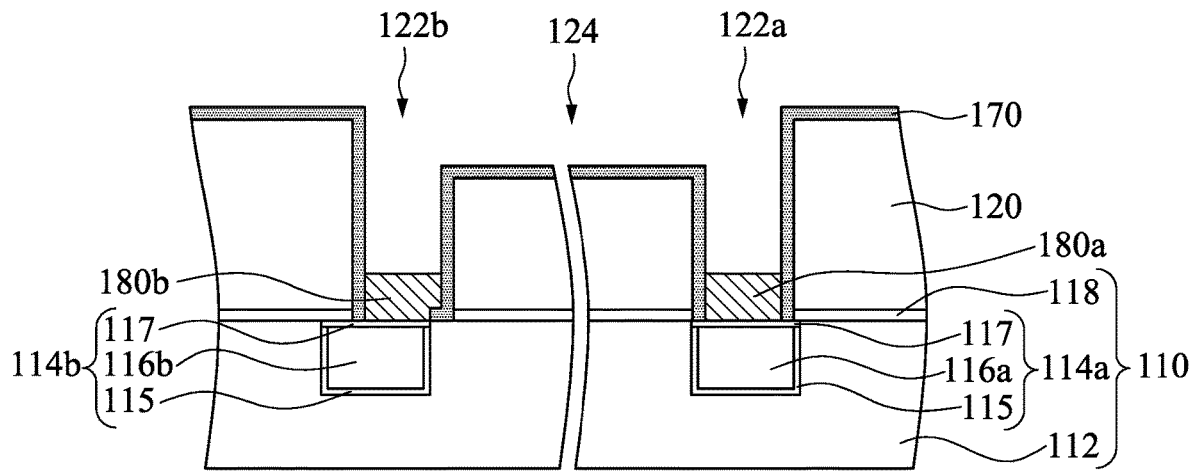

Reference is made to FIG. 1G. Bottom vias 180a and 180b are respectively formed in the openings 122a and 122b and in contact with the dielectric spacer layer 170 and the conductive elements 114a and 114b. The bottom vias 180a and 180b may be formed by PVD, CVD, MOCVD, electroless deposition (ELD), and/or other suitable technique. In some embodiments, the bottom vias 180a and 180b are formed by ELD process, which provides a low process temperature, an intrinsic process selectivity and conformal bottom-up deposition to reduce via trench gap-fill challenge. In some embodiments, the bottom vias 180a and 180b are Cu deposited by ELD process. As shown, the bottom vias 180a and 180b have the dielectric spacer layer 170 as its sidewall spacers and thereby it improves device reliability by limiting electron migration (EM) and time-dependent dielectric breakdown (TDDB) associated with via metal diffusion into the underlying first dielectric layer 112. In some other embodiments, the bottom vias 180a and 180b may be made of other suitable materials, such as metal (Co, W, CoWP, Ru, Al, Ti, or combinations thereof). In some embodiments, the thickness of the bottom vias 180a and 180b is about 3 nm to about 10 nm.

Figure 1H:
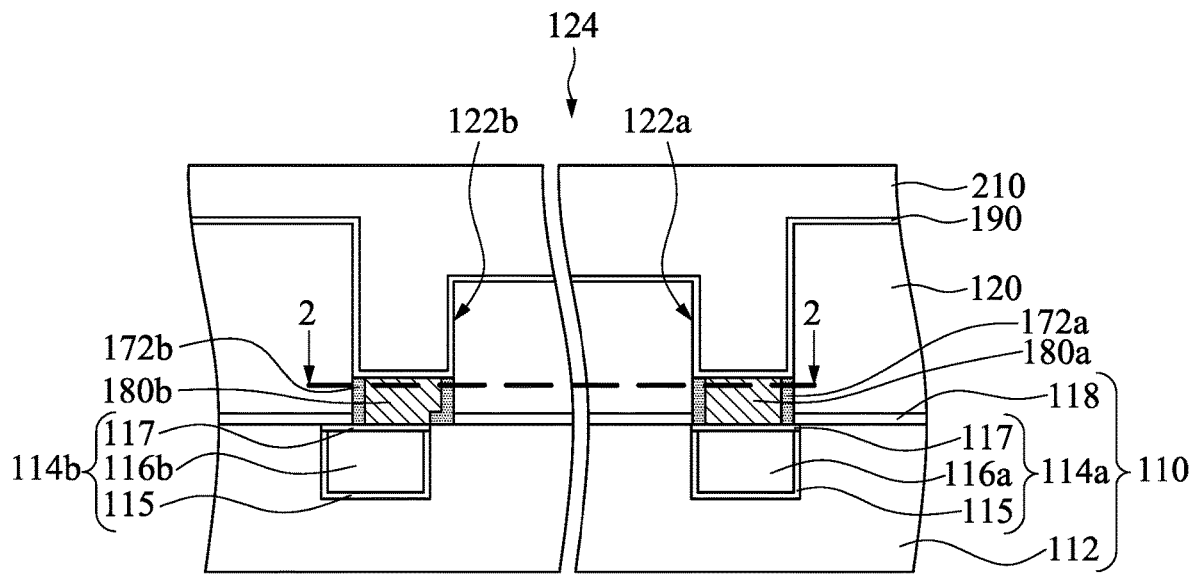
Figure 2:
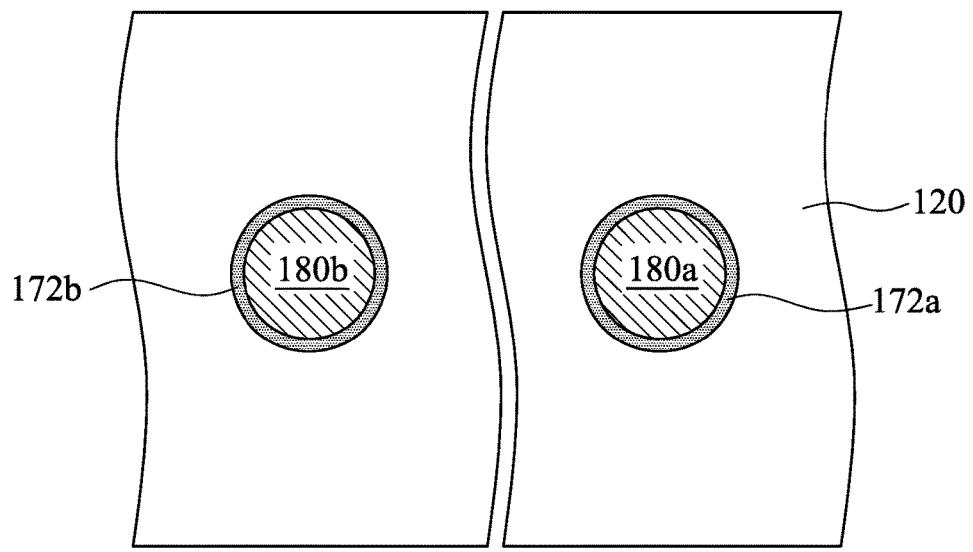
FIG. 2 is a cross-sectional view taking along line 2-2 of FIG. 1H.

Reference is made to FIGS. 1H and 2, where FIG. 2 is a cross-sectional view taking along line 2-2 of FIG. 1H. A portion of the dielectric spacer layer 170 (see FIG. 1G) is removed. The dielectric spacer layer 170 can be removed by performing a selective isotropic etch process. The selective isotropic etch selectively etches the dielectric spacer layer 170 but does not substantially etch the bottom vias 180a and 180b. The dielectric spacer layer 170 is etched in both of vertical and horizontal directions during the selective isotropic dielectric etch. Here the vertical direction is a direction along a stack direction of the first dielectric layer 112 and the second dielectric layer 120 and the horizontal direction is perpendicular to the vertical direction. The dielectric spacer layer 170 is etched to form dielectric spacers 172a and 172b respectively surrounding the bottom vias 180a and 180b. That is, the bottom vias 180a and 180b are spaced from the second dielectric layer 120. As such, the dielectric spacers 172a and 172b and the bottom vias 180a and 180b have substantially the same height. In some other embodiments, however, the dielectric spacers 172a and 172b and the bottom vias 180a and 180b have different heights. The dielectric spacer 172a is in contact with the conductive element 114a, and the dielectric spacer 172b is in contact with the conductive element 114b and the first dielectric layer 112. The selective isotropic dielectric etch may include a dry etch, a wet etch, or a combination thereof.

A barrier layer 190 is conformally formed in the remained openings 122a, 122b, and 124, such that the barrier layer 190 covers and is in contact with the bottom vias 180a, 180b and the dielectric spacers 172a, 172b. In some embodiments, the barrier layer 190 is a metal layer including Ta, TaN, Co, Ru, Ti, TiN, or combinations thereof. The barrier layer 190 may be formed using methods such as physical vapor deposition (PVD), sputtering, chemical vapor deposition (CVD), atomic layer deposition (ALD), and the like.

A conductive material 210 is formed on the barrier layer 190 and fills in the openings 122a, 122b, and 124. The conductive material 210 at least includes metal element, e.g., copper (Cu). The conductive material 210 may include other suitable materials such as Ru, W, Ti, Al, Co, or combinations thereof.

Figure 1I:
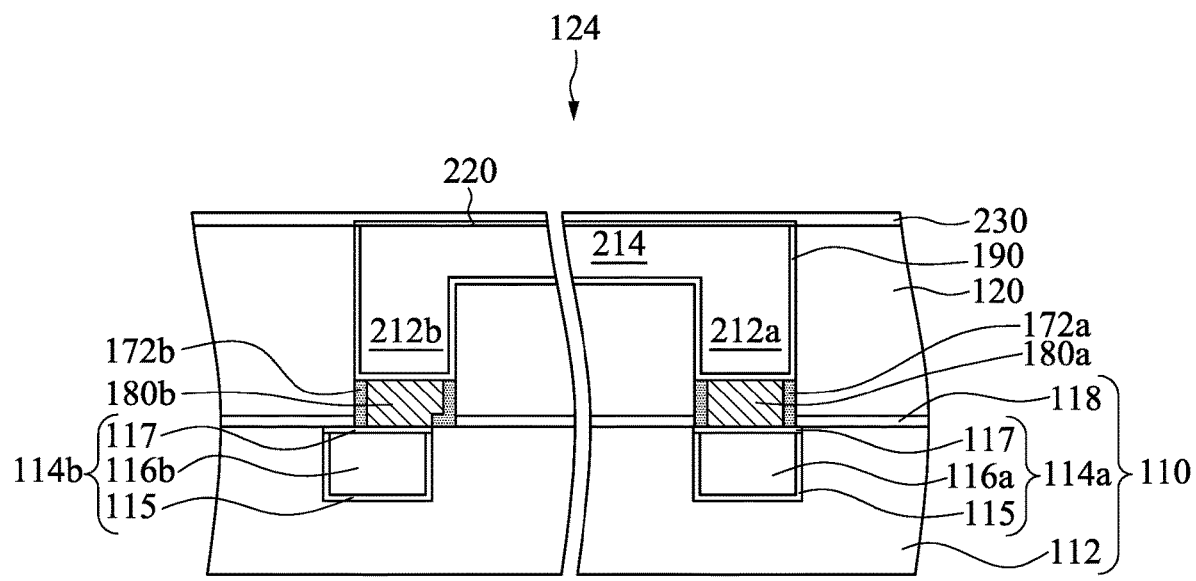

Reference is made to FIG. 1I. A chemical mechanical polishing (CMP) process is performed after the formation of the conductive material 210 (see FIG. 1H) to remove the excess portions of the conductive material 210 and the barrier layer 190 outside the opening 124, thus exposing the top surface of the second dielectric layer 120 and achieving a planarized surface. The portions of the conductive material 210 in the openings 122a and 122b are referred to as top vias 212a and 212b, and the portion of the conductive material 210 in the opening 124 is referred to as a conductive line 214. The top via 212a covers the bottom via 180a and the dielectric spacer 172a, and the top via 212b covers the bottom via 180b and the dielectric spacer 172b. That is, the bottom via 180a and the dielectric spacer 172a are disposed between the top via 212a and the first dielectric layer 112, and the bottom via 180b and the dielectric spacer 172b are disposed between the top via 212b and the first dielectric layer 112. In some embodiments, the conductive line 214 interconnects the top vias 212a and 212b, and the present disclosure is not limited in this respect.

A cap layer 220 is formed on the conductive line 214 and optionally on the barrier layer 190. The cap layer 220 includes materials such as Co, Ta, CoWP, Pt, or combinations thereof. Since the cap layer 220 has a better characteristic match with the conductive line 214 than a dielectric, electro migration and stress migration are reduced and thus device reliability is improved. In some embodiments, the conductive line 214 is a copper or copper alloys so that the cap layer 220 can be formed as a copper silicide. Growth of the cap layer 220 can be performed by a chemical vapor reaction (CVR) process that involves introducing a chemical vapor of $SiH_4$ gas into a chamber to react with copper. In some other embodiments, the cap layer 220 can be formed by electroless plating. In yet some other embodiments, the cap layer 220 can be deposited using common techniques such as sputtering and CVD and then etched.

In some embodiments, an etching stop layer (ESL) 230 is formed on the cap layer 220 and the second dielectric layer 120. The etch stop layers are formed of a dielectric material having a different etch selectivity from adjacent layers, e.g., the underlying second dielectric layer 120. In some embodiments, the etch stop layers may be formed of SiNx, SiCN, $SiO_2$, CN, AlOxNy, combinations thereof, or the like, deposited by CVD or PECVD techniques.

Figure 3A:
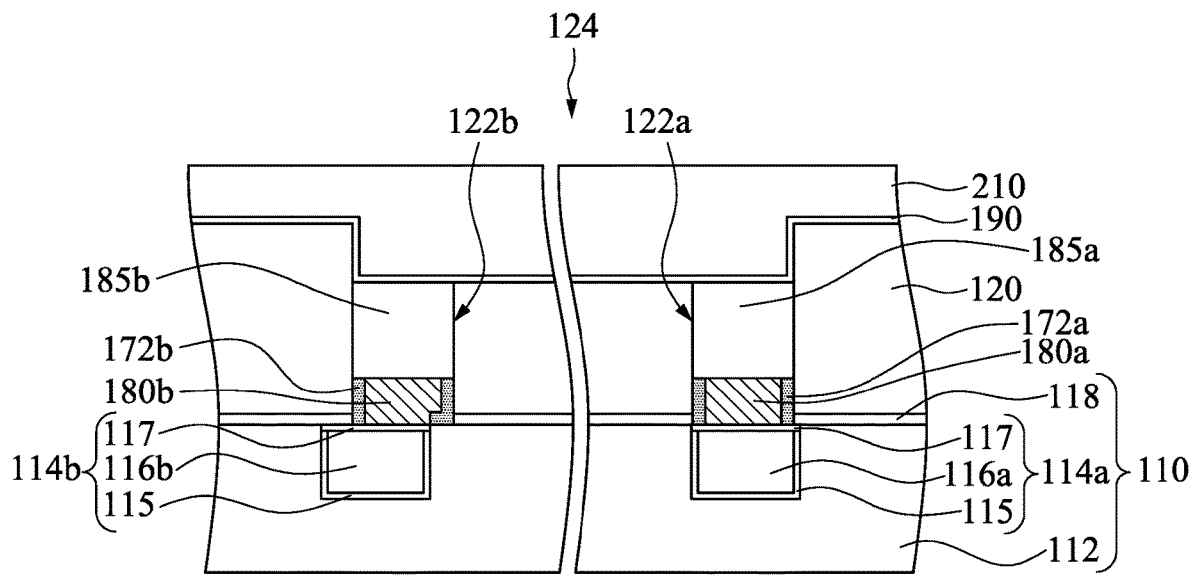
FIGS. 3A to 3B are cross-sectional views of a method for manufacturing an interconnect structure at various stages in accordance with some embodiments of the present disclosure.
Figure 3B:
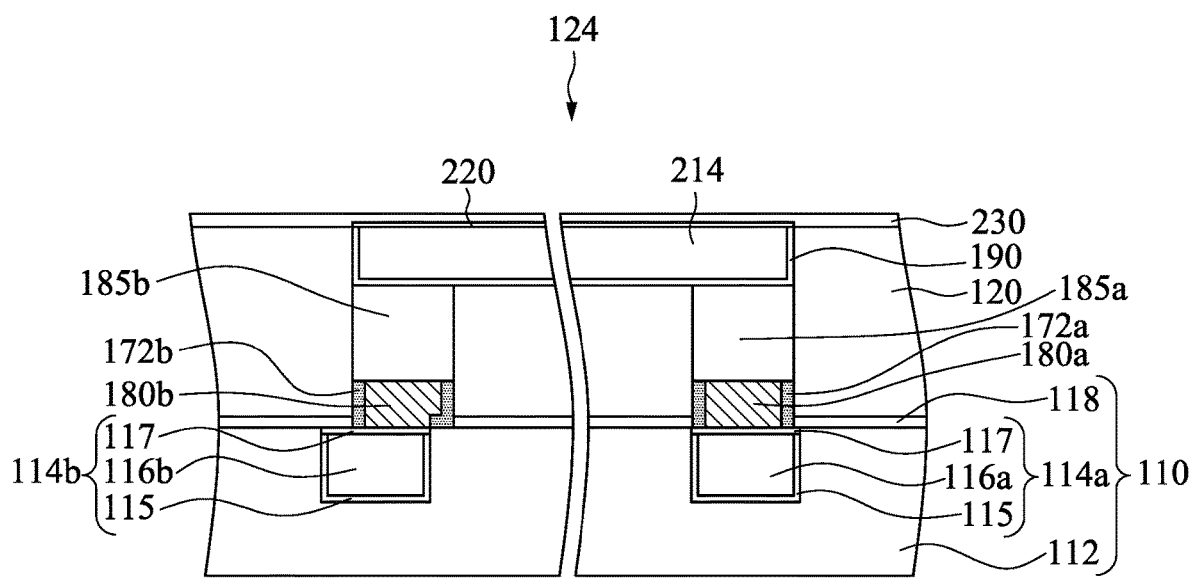

FIGS. 3A to 3B are cross-sectional views of a method for manufacturing an interconnect structure at various stages in accordance with some embodiments of the present disclosure. Reference is made to FIG. 3A. The manufacturing processes of FIG. 1A to FIG. 1G are performed in advance. Since the relevant manufacturing details are similar to the manufacturing details of FIG. 1A to FIG. 1G, and, therefore, a description in this regard will not be repeated hereinafter. A portion of the dielectric spacer layer 170 (see FIG. 1G) is then removed. The dielectric spacer layer 170 can be removed by performing a selective isotropic etch process. The selective isotropic etch selectively etches the dielectric spacer layer 170 but does not substantially etch the bottom vias 180a and 180b. The dielectric spacer layer 170 is etched in both of vertical and horizontal directions during the selective isotropic dielectric etch. The dielectric spacer layer 170 is etched to form dielectric spacers 172a and 172b respectively surrounding the bottom vias 180a and 180b. As such, the dielectric spacers 172a and 172b and the bottom vias 180a and 180b have substantially the same height. In some other embodiments, however, the dielectric spacers 172a and 172b and the bottom vias 180a and 180b have different heights. The dielectric spacer 172a is in contact with the conductive element 114a, and the dielectric spacer 172b is in contact with the conductive element 114b and the first dielectric layer 112. The selective isotropic dielectric etch may include a dry etch, a wet etch, or a combination thereof.

A plurality of top vias 185a and 185b are formed respectively over the bottom vias 180a and 180b and also respectively over the dielectric spacers 172a and 172b to respectively fill the openings 122a and 122b. That is, the top vias 185a covers and is in contact with the bottom vias 180a and the dielectric spacers 172a, and the top vias 185b covers and in contact with the bottom vias 180b and the dielectric spacers 172b. The top vias 185a and 185b may be formed by PVD, CVD, MOCVD, electroless deposition (ELD), and/or other suitable technique. In some embodiments, the top vias 185a and 185b are formed by ELD process. In some embodiments, the top vias 185a and 185b are Cu deposited by ELD process. In some other embodiments, the top vias 185a and 185b may be made of other suitable materials, such as metal (Co, W, CoWP, Ru, Al, Ti, or combinations thereof). In some embodiments, the thickness of the top vias 185a and 185b is about 2 nm to about 40 nm.

A barrier layer 190 is conformally formed in the remained opening 124 and on the top vias 185a and 185b. In some embodiments, the barrier layer 190 is a metal layer including Ta, TaN, Co, Ru, Ti, TiN, or combinations thereof. The barrier layer 190 may be formed using methods such as physical vapor deposition (PVD), sputtering, chemical vapor deposition (CVD), atomic layer deposition (ALD), and the like.

A conductive material 210 is formed on the barrier layer 190 and fills in the opening 124. The conductive material 210 at least includes metal element, e.g., copper (Cu). The conductive material 210 may include other suitable materials such as Ru, W, Ti, Al, Co, or combinations thereof.

Reference is made to FIG. 3B. A chemical mechanical polishing (CMP) process is performed after the formation of the conductive material 210 (see FIG. 3A) to remove the excess portions of the conductive material 210 and the barrier layer 190 outside the opening 124, thus exposing the top surface of the second dielectric layer 120 and achieving a planarized surface. The conductive material 210 in the opening 124 is referred to as a conductive line 214. The top via 185a covers the bottom via 180a and the dielectric spacer 172a, and the top via 185b covers the bottom via 180b and the dielectric spacer 172b. That is, the bottom via 180a and the dielectric spacer 172a are disposed between the top via 185b and the first dielectric layer 112, and the bottom via 180b and the dielectric spacer 172b are disposed between the top via 185b and the first dielectric layer 112.

A cap layer 220 is formed on the conductive line 214 and optionally on the barrier layer 190. The cap layer 220 includes materials such as Co, Ta, CoWP, Pt, or combinations thereof. Since the cap layer 220 has a better characteristic match with the conductive line 214 than a dielectric, electro migration and stress migration are reduced and thus device reliability is improved. In some embodiments, the conductive line 214 is a copper or copper alloys so that the cap layer 220 can be formed as a copper silicide.

Growth of the cap layer 220 can be performed by a chemical vapor reaction (CVR) process that involves introducing a chemical vapor of $SiH_4$ gas into a chamber to react with copper. In some other embodiments, the cap layer 220 can be formed by electroless plating. In yet some other embodiments, the cap layer 220 can be deposited using common techniques such as sputtering and CVD and then etched.

In some embodiments, an etching stop layer (ESL) 230 is formed on the cap layer 220 and the second dielectric layer 120. The etch stop layers are formed of a dielectric material having a different etch selectivity from adjacent layers, e.g., the underlying second dielectric layer 120. In some embodiments, etch stop layers may be formed of SiNx, SiCN, $SiO_2$, CN, AlOxNy, combinations thereof, or the like, deposited by CVD or PECVD techniques.

Figure 4:
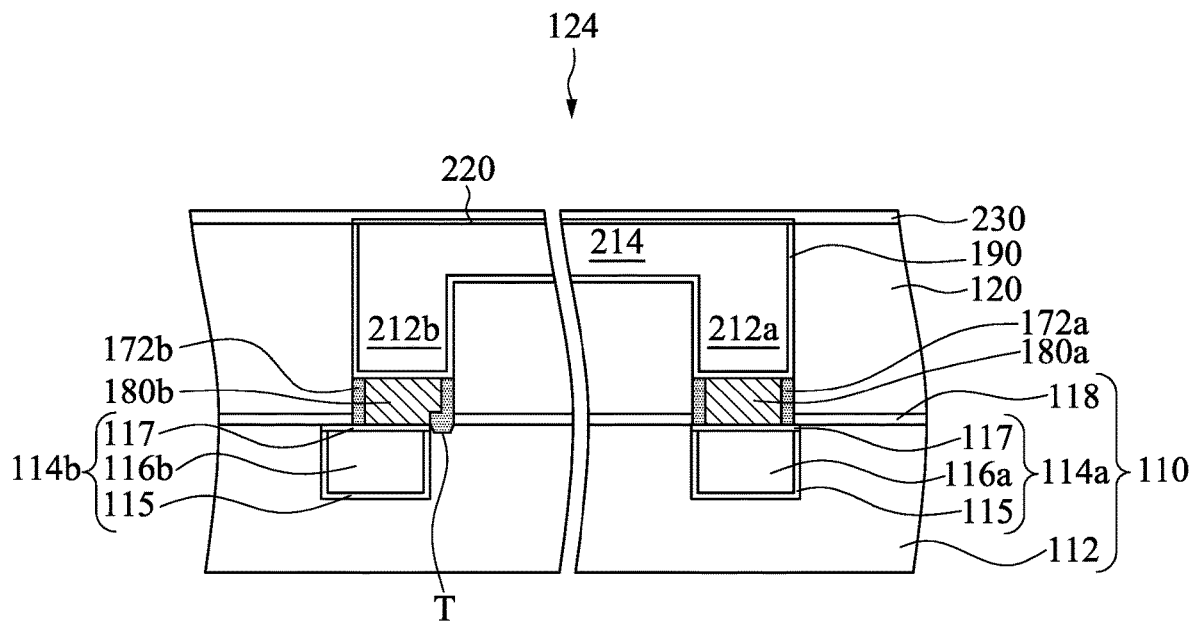
FIG. 4 is a cross-sectional view of an interconnect structure in accordance with some embodiments of the present disclosure.

FIG. 4 is a cross-sectional view of an interconnect structure in accordance with some embodiments of the present disclosure. The difference between FIGS. 4 and 1I pertains to a recess T in the first dielectric layer 112. In FIG. 4, during the via etching process (as described in FIG. 1E), the opening 122b may be overetched and form a recess (also referred to as a tiger tooth) T in the first dielectric layer 112. As such, the dielectric spacer 172b can fill the recess T to strengthen the defect area (i.e., the recess T). In other words, the dielectric spacer 172b can fix the tiger tooth issue. Other relevant structural and manufacturing details of the interconnect structure of FIG. 4 are similar to the interconnect structure of FIG. 1I, and, therefore, a description in this regard will not be repeated hereinafter.

Figure 5:
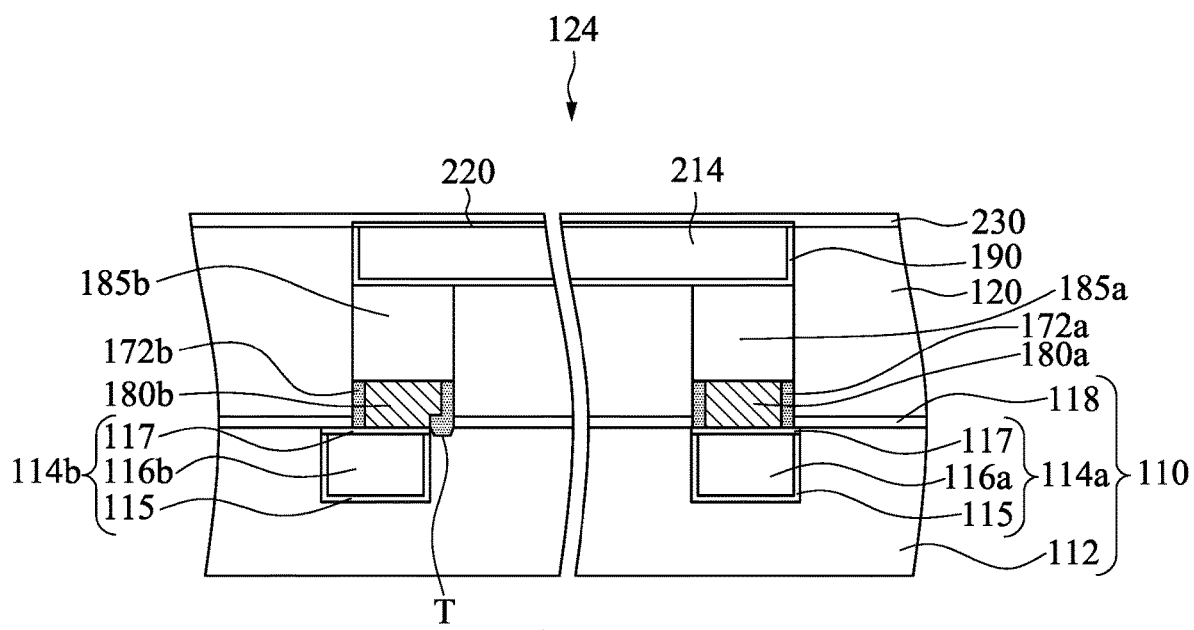
FIG. 5 is a cross-sectional view of an interconnect structure in accordance with some embodiments of the present disclosure.

FIG. 5 is a cross-sectional view of an interconnect structure in accordance with some embodiments of the present disclosure. The difference between FIGS. 5 and 3B pertains to a recess T in the first dielectric layer 112. In FIG. 5, during the via etching process (as described in FIG. 1E), the opening 122b may be overetched and form a recess (also referred to as a tiger tooth) T in the first dielectric layer 112. As such, the dielectric spacer 172b can fill the recess T to strengthen the defect area (i.e., the recess T). In other words, the dielectric spacer 172b can fix the tiger tooth issue. Other relevant structural and manufacturing details of the interconnect structure of FIG. 5 are similar to the interconnect structure of FIG. 3B, and, therefore, a description in this regard will not be repeated hereinafter.

According to the aforementioned embodiments, during the formation of the via, a dielectric spacer is formed under the via, i.e., the dielectric spacer is formed between the via and the conductive element. The dielectric spacer provides additional spacer from neighbor conductive element, improving the misalignment and the tiger tooth problems. Moreover, the dielectric spacer can further provide high capability against breakdown and leakage if the dielectric spacer is made of high-κ dielectrics.

Figure 6A:
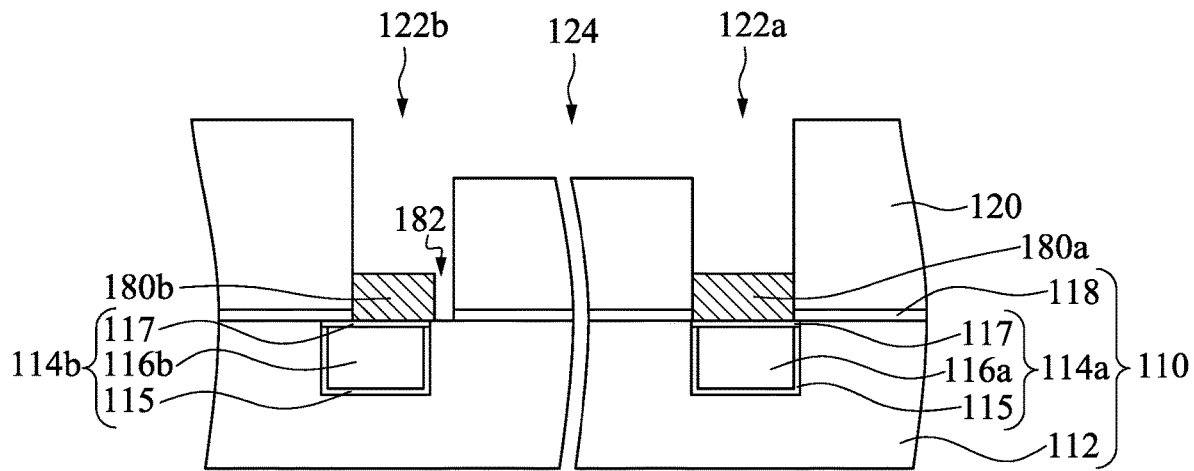
FIGS. 6A to 6D are cross-sectional views of a method for manufacturing an interconnect structure at various stages in accordance with some embodiments of the present disclosure.

FIGS. 6A to 6D are cross-sectional views of a method for manufacturing an interconnect structure at various stages in accordance with some embodiments of the present disclosure. Reference is made to FIG. 6A. The manufacturing processes of FIG. 1A to FIG. 1E are performed in advance. Since the relevant manufacturing details are similar to the manufacturing details of FIG. 1A to FIG. 1E, and, therefore, a description in this regard will not be repeated hereinafter. Bottom vias 180a and 180b are respectively formed (or deposited) on the conductive elements 114a and 114b. The bottom vias 180a and 180b are selectively deposited on exposed metal (i.e., the cap layers 117 in this case) but not on the first dielectric layer 112, such that the bottom vias 180a and 180b are in contact with the second dielectric layer 120. The selective deposition can be performed using electro less deposition (ELD) or CVD processing to a thickness between about 3 nm to about 20 nm. Since the deposition of the bottom vias 180a and 180b is selective, a gap 182 can be formed in the opening 122b to expose the first dielectric layer 112 and there is no gap formed in the opening 122a. The size of the gap 182 depends on the misalignment degree of the opening 122b and the conductive element 114b. That is, the gap 182 increases if the misalignment degree of the opening 122b and the conductive element 114b increases. In some embodiments, the bottom vias 180a and 180b are made of metals, such as Co or other suitable materials.

Figure 6B:
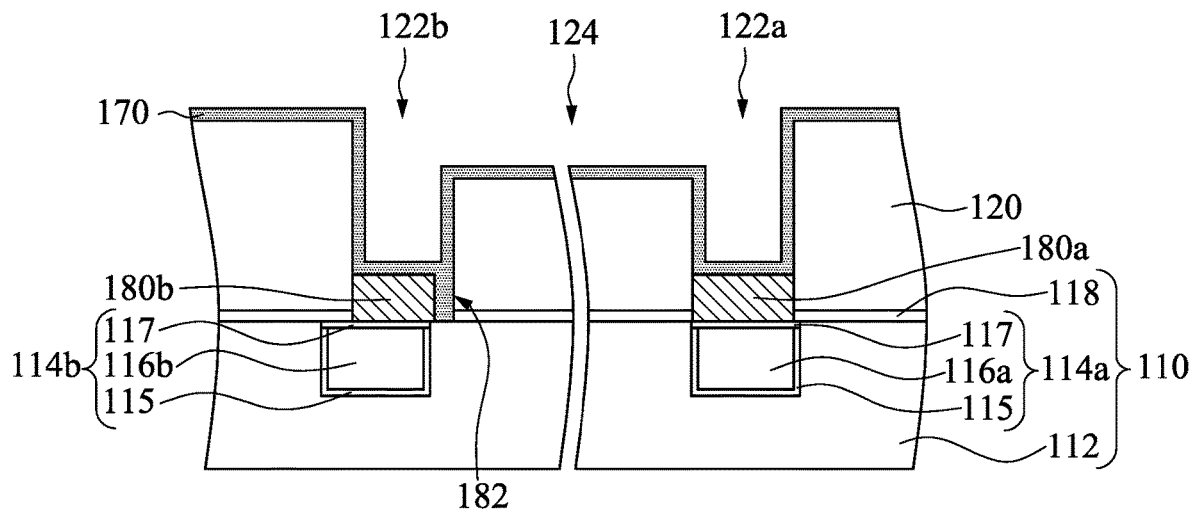

Reference is made to FIG. 6B. A dielectric spacer layer 170 is conformally formed on the structure of FIG. 6A. In some embodiments, the dielectric spacer layer 170 is formed by an ALD, CVD, PVD process or other suitable process. In some embodiments, the thickness of the dielectric spacer layer 170 is about 1 nm to about 4 nm.

Figure 6C:
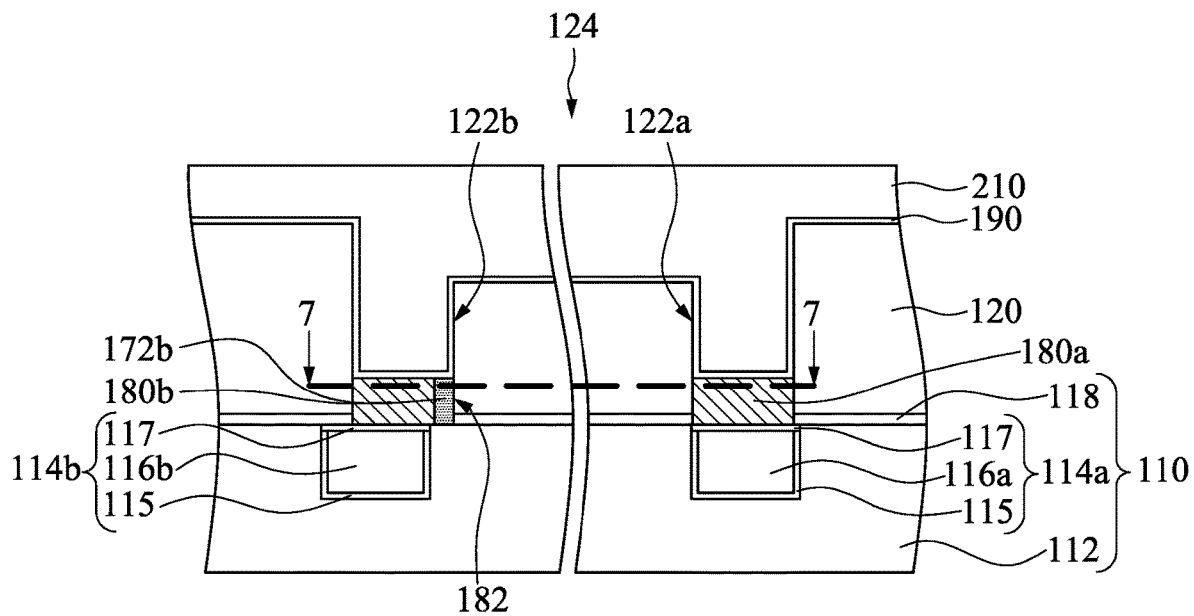
Figure 7:
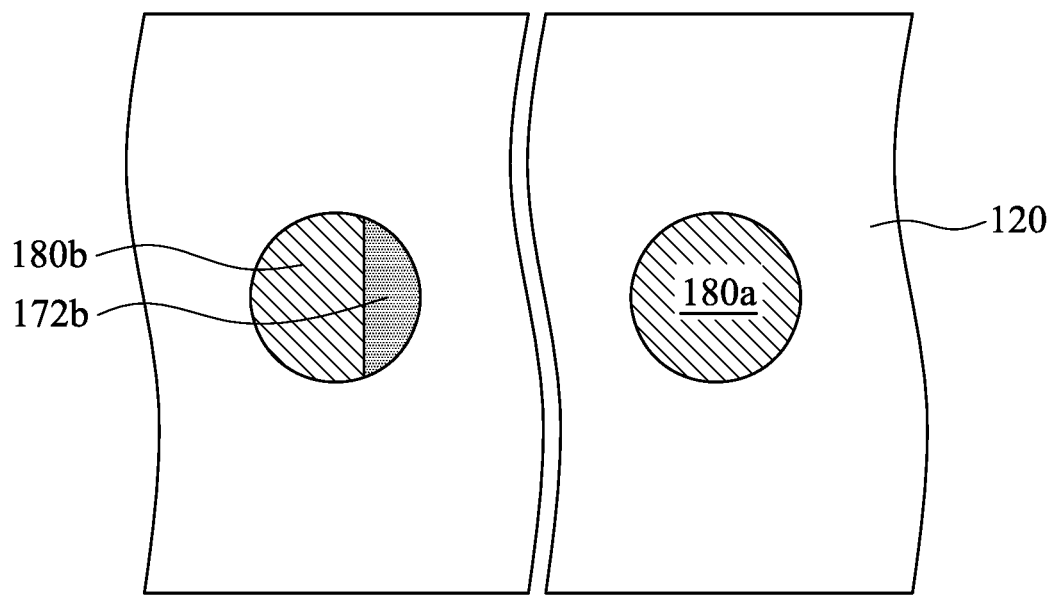
FIG. 7 is a cross-sectional view taking along line 7-7 of FIG. 6C.

Reference is made to FIGS. 6C and 7, where FIG. 7 is a cross-sectional view taking along line 7-7 of FIG. 6C. A portion of the dielectric spacer layer 170 (see FIG. 6B) is removed. The dielectric spacer layer 170 can be removed by performing a selective isotropic etch process. The selective isotropic etch selectively etches the dielectric spacer layer 170 but does not substantially etch the bottom vias 180a and 180b. The dielectric spacer layer 170 is etched in both of vertical and horizontal directions during the selective isotropic dielectric etch. The dielectric spacer layer 170 is etched to form a dielectric spacer 172b in the gap 182 and between the bottom via 180b and the second dielectric layer 120. As such, the dielectric spacer 172b and the bottom via 180b have substantially the same height. In some other embodiments, however, the dielectric spacer 172b and the bottom via 180b have different heights. The dielectric spacer 172b is in contact with the first dielectric layer 112. The selective isotropic dielectric etch may include a dry etch, a wet etch, or a combination thereof.

A barrier layer 190 is conformally formed in the remained openings 122a, 122b, and 124, such that the barrier layer 190 covers and is in contact with the bottom vias 180a, 180b and the dielectric spacer 172b. In some embodiments, the barrier layer 190 is a metal layer including Ta, TaN, Co, Ru, Ti, TiN, or combinations thereof. The barrier layer 190 may be formed using methods such as physical vapor deposition (PVD), sputtering, chemical vapor deposition (CVD), atomic layer deposition (ALD), and the like.

A conductive material 210 is formed on the barrier layer 190 and fills in the openings 122a, 122b, and 124. The conductive material 210 at least includes metal element, e.g., copper (Cu). The conductive material 210 may include other suitable materials such as Ru, W, Ti, Al, Co, or combinations thereof.

Figure 6D:
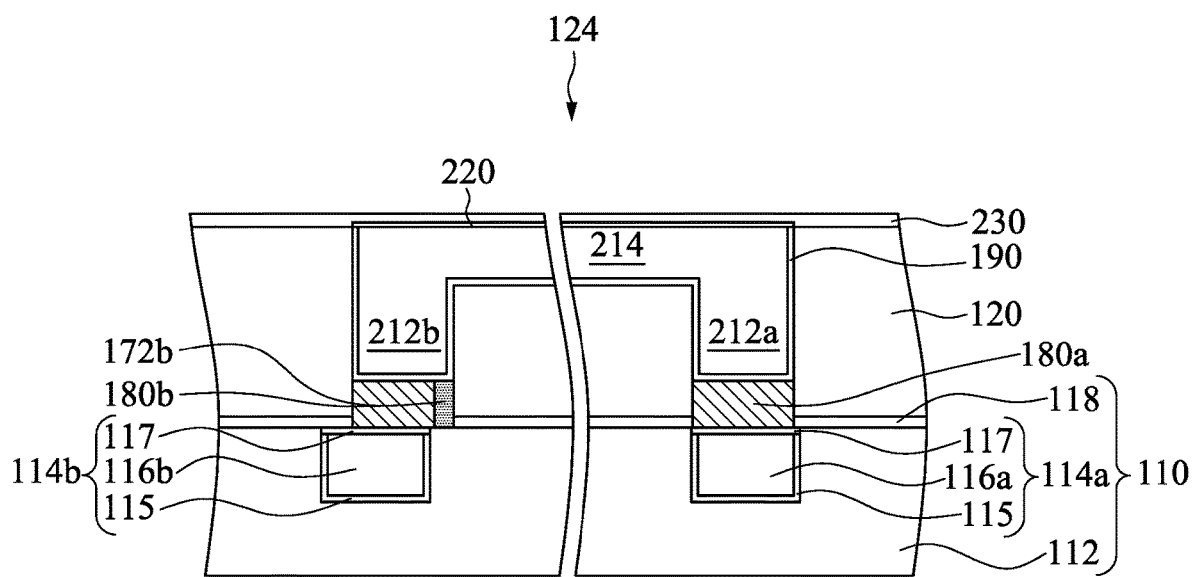

Reference is made to FIG. 6D. A chemical mechanical polishing (CMP) process is performed after the formation of the conductive material 210 (see FIG. 6C) to remove the excess portions of the conductive material 210 and the barrier layer 190 outside the opening 124, thus exposing the top surface of the second dielectric layer 120 and achieving a planarized surface. The portions of the conductive material 210 in the openings 122a and 122b are referred to as top vias 212a and 212b, and the portion of the conductive material 210 in the opening 124 is referred to as a conductive line 214. The top via 212b covers the bottom via 180b and the dielectric spacer 172b. That is, the bottom via 180b and the dielectric spacer 172b are disposed between the top via 212b and the first dielectric layer 112.

A cap layer 220 is formed on the conductive line 214 and optionally on the barrier layer 190. The cap layer 220 includes materials such as Co, Ta, CoWP, Pt, or combinations thereof. Since the cap layer 220 has a better characteristic match with the conductive line 214 than a dielectric, electro migration and stress migration are reduced and thus device reliability is improved. In some embodiments, the conductive line 214 is a copper or copper alloys so that the cap layer 220 can be formed as a copper silicide. Growth of the cap layer 220 can be performed by a chemical vapor reaction (CVR) process that involves introducing a chemical vapor of SiH$_4$ gas into a chamber to react with copper. In some other embodiments, the cap layer 220 can be formed by electroless plating. In yet some other embodiments, the cap layer 220 can be deposited using common techniques such as sputtering and CVD and then etched.

In some embodiments, an etching stop layer (ESL) 230 is formed on the cap layer 220 and the second dielectric layer 120. The etch stop layers are formed of a dielectric material having a different etch selectivity from adjacent layers, e.g., the underlying second dielectric layer 120. In some embodiments, the etch stop layers may be formed of SiNx, SiCN, SiO$_2$, CN, AlOxNy, combinations thereof, or the like, deposited by CVD or PECVD techniques.

Figure 8A:
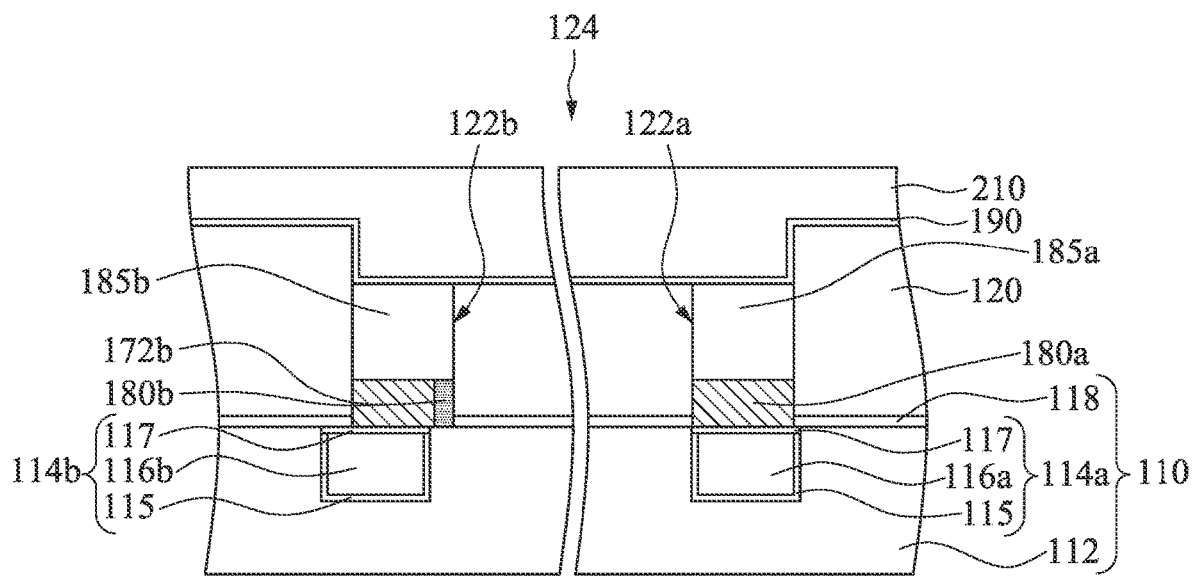
FIGS. 8A to 8B are cross-sectional views of a method for manufacturing an interconnect structure at various stages in accordance with some embodiments of the present disclosure.
Figure 8B:
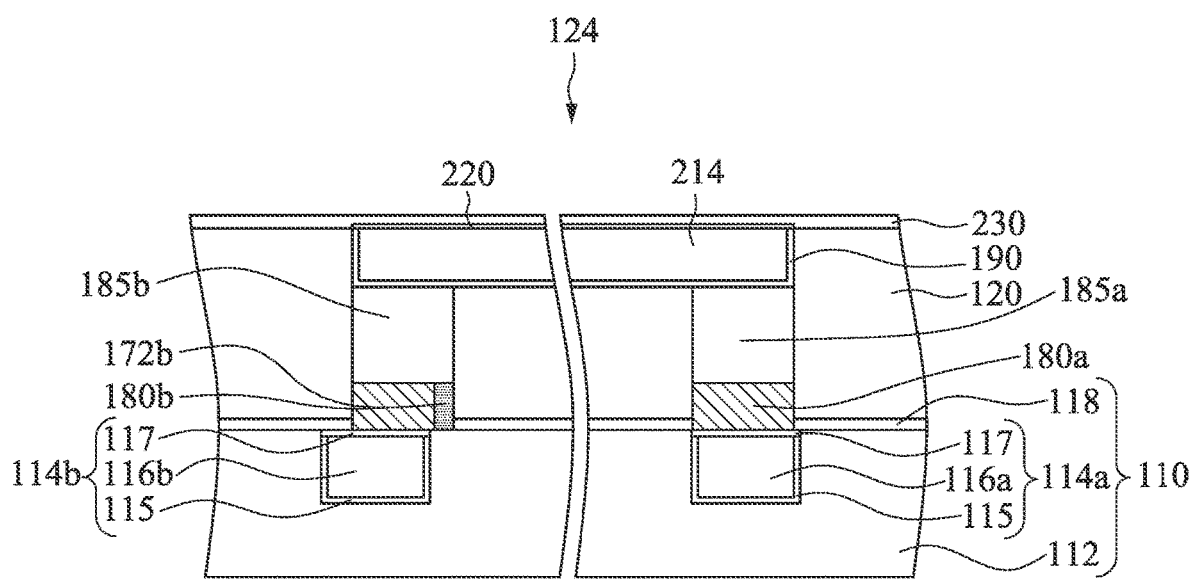

FIGS. 8A to 8B are cross-sectional views of a method for manufacturing an interconnect structure at various stages in accordance with some embodiments of the present disclosure. Reference is made to FIG. 8A. The manufacturing processes of FIG. 1A to FIG. 1E and then FIG. 6A to FIG. 6B are performed in advance. Since the relevant manufacturing details are similar to the manufacturing details of FIG. 1A to FIG. 1E and FIG. 6A to FIG. 6B, and, therefore, a description in this regard will not be repeated hereinafter. A portion of the dielectric spacer layer 170 (see FIG. 6B) is then removed. The dielectric spacer layer 170 can be removed by performing a selective isotropic etch process. The selective isotropic etch selectively etches the dielectric spacer layer 170 but does not substantially etch the bottom vias 180a and 180b. The dielectric spacer layer 170 is etched in both of vertical and horizontal directions during the selective isotropic dielectric etch. The dielectric spacer layer 170 is etched to form a dielectric spacer 172b in the gap 182 and between the bottom via 180b and the second dielectric layer 120. As such, the dielectric spacer 172b and the bottom via 180b have substantially the same height. In some other embodiments, however, the dielectric spacer 172b and the bottom via 180b have different heights. The dielectric spacer 172b is in contact with the first dielectric layer 112. The selective isotropic dielectric etch may include a dry etch, a wet etch, or a combination thereof.

Top vias 185a and 185b are formed respectively on the bottom vias 180a and 180b to respectively fill the openings 122a and 122b. The top via 185b is further formed on the dielectric spacer 172b. That is, the top vias 185a covers and is in contact with the bottom vias 180a, and the top vias 185b covers and in contact with the bottom vias 180b and the dielectric spacer 172b. The top vias 185a and 185b may be formed by PVD, CVD, MOCVD, electroless deposition (ELD), and/or other suitable technique. In some embodiments, the top vias 185a and 185b are formed by ELD process. In some embodiments, the top vias 185a and 185b are Cu deposited by ELD process. In some other embodiments, the top vias 185a and 185b may be made of other suitable materials, such as metal (Co, W, CoWP, Ru, Al, Ti, or combinations thereof). In some embodiments, the thickness of the top vias 185a and 185b is about 2 nm to about 40 nm.

A barrier layer 190 is conformally formed in the remained opening 124 and on the top vias 185a and 185b. In some embodiments, the barrier layer 190 is a metal layer including Ta, TaN, Co, Ru, Ti, TiN, or combinations thereof. The barrier layer 190 may be formed using methods such as physical vapor deposition (PVD), sputtering, chemical vapor deposition (CVD), atomic layer deposition (ALD), and the like.

A conductive material 210 is formed on the barrier layer 190 and fills in the opening 124. The conductive material 210 at least includes metal element, e.g., copper (Cu). The conductive material 210 may include other suitable materials such as Ru, W, Ti, Al, Co, or combinations thereof.

Reference is made to FIG. 8B. A chemical mechanical polishing (CMP) process is performed after the formation of the conductive material 210 (see FIG. 8A) to remove the excess portions of the conductive material 210 and the barrier layer 190 outside the opening 124, thus exposing the top surface of the second dielectric layer 120 and achieving a planarized surface. The conductive material 210 in the opening 124 is referred to as a conductive line 214. The top via 185b covers the bottom via 180b and the dielectric spacer 172b.

A cap layer 220 is formed on the conductive line 214 and optionally on the barrier layer 190. The cap layer 220 includes materials such as Co, Ta, CoWP, Pt, or combinations thereof. Since the cap layer 220 has a better characteristic match with the conductive line 214 than a dielectric, electro migration and stress migration are reduced and thus device reliability is improved. In some embodiments, the conductive line 214 is a copper or copper alloys so that the cap layer 220 can be formed as a copper silicide. Growth of the cap layer 220 can be performed by a chemical vapor reaction (CVR) process that involves introducing a chemical vapor of SiH$_4$ gas into a chamber to react with copper. In some other embodiments, the cap layer 220 can be formed by electroless plating. In yet some other embodiments, the cap layer 220 can be deposited using common techniques such as sputtering and CVD and then etched.

In some embodiments, an etching stop layer (ESL) 230 is formed on the cap layer 220 and the second dielectric layer 120. The etch stop layers are formed of a dielectric material having a different etch selectivity from adjacent layers, e.g., the underlying second dielectric layer 120. In some embodiments, etch stop layers may be formed of SiNx, SiCN, SiO$_2$, CN, AlOxNy, combinations thereof, or the like, deposited by CVD or PECVD techniques.

Figure 9:
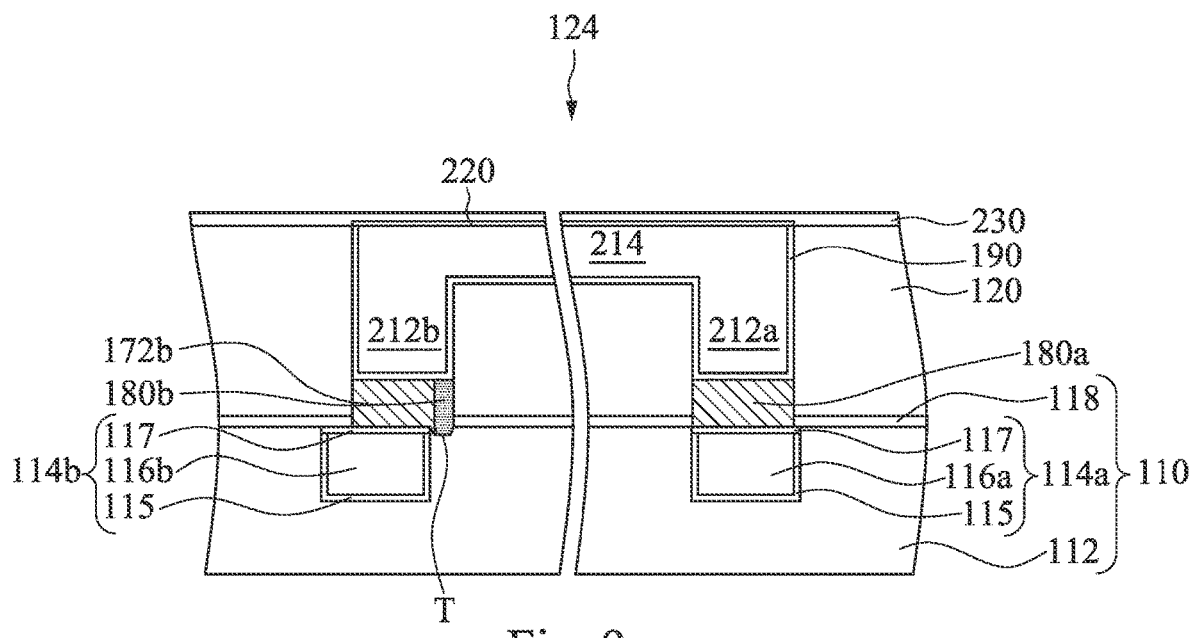
FIG. 9 is a cross-sectional view of an interconnect structure in accordance with some embodiments of the present disclosure.

FIG. 9 is a cross-sectional view of an interconnect structure in accordance with some embodiments of the present disclosure. The difference between FIGS. 9 and 6D pertains to a recess T in the first dielectric layer 112. In FIG. 9, during the via etching process (as described in FIG. 1E), the opening 122b may be overetched and form a recess (also referred to as a tiger tooth) T in the first dielectric layer 112. As such, the dielectric spacer 172b can fill the recess T to strengthen the defect area (i.e., the recess T). In other words, the dielectric spacer 172b can fix the tiger tooth issue. Other relevant structural and manufacturing details of the interconnect structure of FIG. 9 are similar to the interconnect structure of FIG. 6D, and, therefore, a description in this regard will not be repeated hereinafter.

Figure 10:
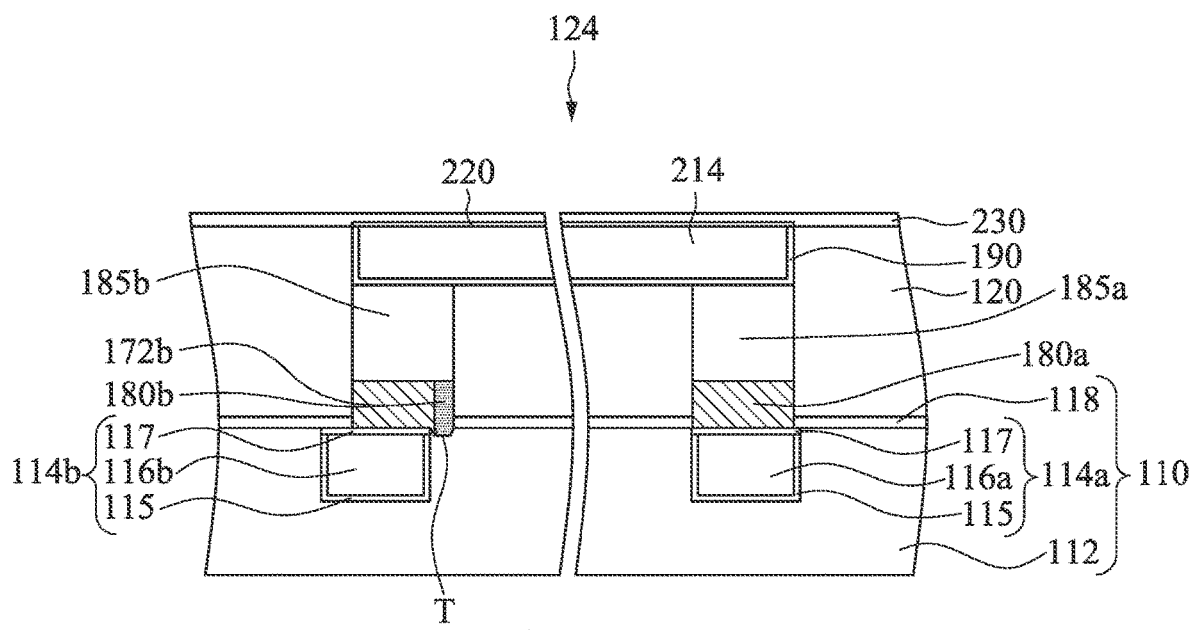
FIG. 10 is a cross-sectional view of an interconnect structure in accordance with some embodiments of the present disclosure.

FIG. 10 is a cross-sectional view of an interconnect structure in accordance with some embodiments of the present disclosure. The difference between FIGS. 10 and 8B pertains to a recess T in the first dielectric layer 112. In FIG. 10, during the via etching process (as described in FIG. 1E), the opening 122b may be overetched and form a recess (also referred to as a tiger tooth) T in the first dielectric layer 112. As such, the dielectric spacer 172b can fill the recess T to strengthen the defect area (i.e., the recess T). In other words, the dielectric spacer 172b can fix the tiger tooth issue. Other relevant structural and manufacturing details of the interconnect structure of FIG. 10 are similar to the interconnect structure of FIG. 8B, and, therefore, a description in this regard will not be repeated hereinafter.

According to the aforementioned embodiments, during the formation of the via, a dielectric spacer is formed under the via, i.e., the dielectric spacer is formed between the via and the conductive element. The dielectric spacer provides additional spacer from neighbor conductive element, improving the misalignment and the tiger tooth problems. Moreover, the dielectric spacer can further provide high capacitance against breakdown and leakage if the dielectric spacer is made of high-κ dielectrics. Furthermore, the dielectric spacer is absent if the via and the conductive element is aligned.

According to some embodiments, an interconnection structure includes a first dielectric layer, a conductive element, a second dielectric layer, a bottom via, a dielectric spacer, and a top via. The conductive element is embedded in the first dielectric layer. The second dielectric layer is over the first dielectric layer and the conductive element. The second dielectric layer has an opening exposing the conductive element. The bottom via is disposed in the opening and in contact with the conductive element. The dielectric spacer is disposed in the opening and is in contact with the bottom via and the second dielectric layer. The top via is disposed in the opening and covering the bottom via and the dielectric spacer.

According to some embodiments, a method for manufacturing an interconnection structure includes forming a second dielectric layer on a wafer. The wafer includes a first dielectric layer and a conductive element embedded in the first dielectric layer. An opening is formed in the second dielectric layer to expose the conductive element. A dielectric spacer layer is selectively formed to be in contact with surfaces defining the opening of the second dielectric layer. The dielectric spacer layer exposes the conductive element. A bottom via is formed in the opening and in contact with the dielectric spacer layer and the conductive element. A portion of the dielectric spacer layer is removed to form a dielectric spacer in contact with the bottom via. A top via is formed in the opening and over the bottom via and the dielectric spacer.

According to some embodiments, a method for manufacturing an interconnection structure includes forming a second dielectric layer on a wafer. The wafer comprising a first dielectric layer and a conductive element embedded in the first dielectric layer. An opening is formed in the second dielectric layer to expose the conductive element. A bottom via is selectively formed in the opening and over the conductive element. The bottom via and the second dielectric layer define a gap therebetween. A dielectric spacer is formed in the gap and in contact with the bottom via, the first dielectric layer, and the second dielectric layer. A top via is formed in the opening and over the bottom via and the dielectric spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   providing a semiconductor structure comprising a dielectric layer having an opening exposing a top surface of a metal layer;
   forming a spacer layer lining a sidewall of the opening and exposing a portion of the metal layer;
   selectively depositing a bottom via in the opening and over the portion of the metal layer;
   etching the spacer layer to lower a top surface of the spacer layer;
   depositing a barrier layer over the bottom via and the etched spacer layer, and in contact with the dielectric layer at the sidewall of the opening after etching back the spacer layer; and
   forming a top via in the opening, in contact with the barrier layer, and over the bottom via, wherein the top via is separated from the dielectric layer by the barrier layer.

2. The method of claim 1, wherein the barrier layer is in contact with the bottom via.

3. The method of claim 1, wherein the barrier layer comprises Ta, TaN, Co, Ru, Ti, TiN, or combinations thereof.

4. The method of claim 1, wherein the barrier layer is spaced apart from the metal layer of the semiconductor structure.

5. The method of claim 1, wherein a bottom surface of the barrier layer is higher than a bottom surface of the dielectric layer.

6. The method of claim 1, wherein the bottom via comprises Co, W, Ru, Al, Ti, or combinations thereof.

7. The method of claim 1, wherein etching the spacer layer is performed such that a top portion of the spacer layer higher than a top surface of the bottom via is removed.

8. The method of claim 1, wherein the spacer layer is formed lining a top surface of the dielectric layer.

9. The method of claim 1, wherein the bottom via is in contact with the spacer layer.

10. A method comprising:
    providing a semiconductor structure comprising a dielectric layer having an opening exposing a top surface of a metal layer;
    selectively depositing a spacer layer on a sidewall of the dielectric layer, wherein the spacer layer exposes the top surface of the metal layer;
    depositing a bottom via in the opening, wherein the bottom via is separated from the dielectric layer by the spacer layer and is in contact with the top surface of the metal layer;
    removing a portion of the spacer layer higher than the bottom via after depositing the bottom via; and
    depositing a barrier layer in the opening and in contact with the bottom via and a remaining portion of the spacer layer.

11. The method of claim 10, further comprising depositing a top via over the bottom via and the spacer layer.

12. The method of claim 11, further comprising forming a cap layer over the top via.

13. The method of claim 11, wherein the barrier layer is formed over the bottom via and the remaining portion of the spacer layer prior to depositing the top via.

14. The method of claim 10, wherein the spacer layer is deposited lining a top surface of the dielectric layer.

15. The method of claim 10, wherein the semiconductor structure further comprises a bottom dielectric layer below the dielectric layer, and the opening of the dielectric layer exposes the bottom dielectric layer, and wherein depositing the spacer layer is performed such that the spacer layer is formed on a top surface of the bottom dielectric layer.

16. A method comprising:
providing a semiconductor structure comprising a top dielectric layer having an opening exposing a top surface of a metal layer and a top surface of a bottom dielectric layer;
depositing a spacer layer in the opening and covering the top surface of the bottom dielectric layer but exposing at least a portion of the top surface of the metal layer;
depositing a bottom via in the opening and in contact with the metal layer, wherein a portion of the bottom via is directly over the spacer layer;
removing a top portion of the spacer layer higher than a top surface of the bottom via, wherein a remaining portion of the spacer layer remains at a sidewall of the bottom via; and
depositing a barrier layer in the opening and covering the bottom via and the remaining portion of the spacer layer.

17. The method of claim 16, wherein the remaining portion of the spacer layer is in contact with the top surface of the bottom dielectric layer.

18. The method of claim 16, further comprising depositing a top via in the opening and over the barrier layer.

19. The method of claim 18, wherein the top via is separated from the remaining portion of the spacer layer by the barrier layer.

20. The method of claim 16, wherein the top surface of the bottom via is substantially coplanar with a top surface of the remaining portion of the spacer layer.

* * * * *